(12) United States Patent
Chen et al.

(10) Patent No.: US 11,785,802 B2
(45) Date of Patent: Oct. 10, 2023

(54) DISPLAY PANEL AND DISPLAY DEVICE PROVIDED WITH HEAT CONDUCTING LAYER

(71) Applicants: Chongqing BOE Display Technology Co., Ltd., Chongqing (CN); BOE TECHNOLOGY GROUP CO., LTD., Beijing (CN)

(72) Inventors: Teng Chen, Beijing (CN); Shicheng Sun, Beijing (CN); Bo Yang, Beijing (CN); Weixin Meng, Beijing (CN); Jonguk Kwak, Beijing (CN)

(73) Assignees: Chongqing BOE Display Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 17/205,025

(22) Filed: Mar. 18, 2021

(65) Prior Publication Data

US 2021/0296610 A1     Sep. 23, 2021

(30) Foreign Application Priority Data

Mar. 19, 2020   (CN) .......................... 202010197611.5

(51) Int. Cl.
*H10K 50/87*       (2023.01)
*G06F 3/041*       (2006.01)
(Continued)

(52) U.S. Cl.
CPC ............ *H10K 50/87* (2023.02); *G06F 3/047* (2013.01); *G06F 3/04164* (2019.05);
(Continued)

(58) Field of Classification Search
CPC combination set(s) only.
See application file for complete search history.

(56) References Cited

U.S. PATENT DOCUMENTS

| 2009/0256169 A1 | 10/2009 | Yokoyama et al. |
| 2014/0042424 A1 | 2/2014 | Yamakita et al. |
| (Continued) |

FOREIGN PATENT DOCUMENTS

| CN | 107195795 A | 9/2017 |
| CN | 109817829 A | 5/2019 |
| (Continued) |

OTHER PUBLICATIONS

China National Intellectual Property Administration, First office action of Chinese application No. 202010197611.5 dated Jun. 6, 2022, which is foreign counterpart application of this US application.

*Primary Examiner* — Nduka E Ojeh
(74) *Attorney, Agent, or Firm* — Lippes Mathias LLP

(57) ABSTRACT

A display panel includes an array substrate, an OLED light-emitting layer and a color filter structure laminated in sequence, the color filter structure including a color filter layer, a black matrix and a heat conducting layer, wherein the color filter layer and the black matrix are disposed in a same layer, the heat conducting layer is disposed on at least one side of the black matrix and configured to conduct heat from the black matrix to a periphery of the color filter structure.

16 Claims, 9 Drawing Sheets

(51) Int. Cl.
  *G06F 3/047* (2006.01)
  *H10K 50/856* (2023.01)
  *H10K 50/86* (2023.01)
  *H10K 59/38* (2023.01)
  *H10K 59/40* (2023.01)
  *H10K 71/00* (2023.01)

(52) U.S. Cl.
  CPC ......... *H10K 50/856* (2023.02); *H10K 50/865* (2023.02); *H10K 59/38* (2023.02); *H10K 59/40* (2023.02); *H10K 71/00* (2023.02)

(56) References Cited

U.S. PATENT DOCUMENTS

| | | | |
|---|---|---|---|
| 2014/0374726 A1 | 12/2014 | Goeoetz et al. | |
| 2017/0010712 A1 | 1/2017 | Yoshizumi et al. | |
| 2017/0139113 A1* | 5/2017 | Peeters | G02B 6/0085 |
| 2017/0194595 A1* | 7/2017 | Li | H10K 50/87 |
| 2019/0198802 A1* | 6/2019 | Lee | H10K 71/00 |
| 2019/0363268 A1 | 11/2019 | Xu et al. | |
| 2020/0328373 A1 | 10/2020 | Huang et al. | |
| 2020/0373513 A1* | 11/2020 | Kim | H10K 59/38 |

FOREIGN PATENT DOCUMENTS

| | | | |
|---|---|---|---|
| CN | 110260993 | A | 9/2019 |
| CN | 110299469 | A | 10/2019 |
| CN | 110675760 | A | 1/2020 |
| CN | 110867471 | A | 3/2020 |
| WO | 2011143126 | A2 | 11/2011 |
| WO | 2019019656 | A1 | 1/2019 |

\* cited by examiner

DISPLAY PANEL AND DISPLAY DEVICE PROVIDED WITH HEAT CONDUCTING LAYER

CROSS REFERENCE TO RELATED APPLICATIONS

This application claims priority to Chinese Patent Application No. 202010197611.5, filed on Mar. 19, 2020 and entitled "DISPLAY PANEL AND DISPLAY DEVICE", the entire content of which is incorporated herein by reference.

TECHNICAL FIELD

The present disclosure relates to the field of display technologies, and in particular to a display panel and a display device.

BACKGROUND

A display panel is often exposed to direct sunlight when used outdoors, which causes the temperature of the display panel to rise.

A display panel generally includes a heat dissipating film, an array substrate, an organic light-emitting diode (OLED) light-emitting layer, and a color filter structure laminated in sequence. The color filter structure includes a color filter layer (also called a color filter (CF)) and a black matrix (BM), and enables the display panel to emit light of different colors.

SUMMARY

The present disclosure provides a display panel and a display device.

In an aspect, a display panel is provided. The display panel includes an array substrate, an OLED light-emitting layer and a color filter structure laminated in sequence. The color filter structure includes a color filter layer, a black matrix and a heat conducting layer. The color filter layer and the black matrix are disposed in a same layer. The heat conducting layer is disposed on at least one side face of the black matrix and configured to conduct heat from the black matrix to a periphery of the color filter structure.

In some embodiments, the heat conducting layer is a meshy metal layer, and an area of the meshy metal layer corresponding to the color filter layer is an opening area; and at least part of the heat conducting layer is disposed between a layer where the black matrix is disposed and the OLED light-emitting layer in a direction perpendicular to the array substrate.

In some embodiments, the black matrix includes a first side face and a second side face connected to each other, the first side face faces the OLED light-emitting layer, and the second side face faces the color filter layer; and the heat conducting layer includes a reflecting portion and a heat conducting portion connected to each other, the heat conducting portion is disposed on the first side face of the black matrix, and the reflecting portion is disposed on the second side face of the black matrix.

In some embodiments, a dihedral angle formed by a first surface of the reflecting portion and a first surface of the heat conducting portion ranges from 70° to 110°. The first surface of the reflecting portion is a surface of the reflecting portion facing the color filter layer, and the first surface of the heat conducting portion is a surface of the heat conducting portion facing the OLED light-emitting layer.

In some embodiments, the display panel further includes a touch layer, the heat conducting layer and the touch layer are disposed in the same layer, and the touch layer and the heat conducting layer are insulated from each other.

In some embodiments, the touch layer includes a plurality of first touch traces and a plurality of second touch traces. The first touch traces and the second touch traces are insulated from each other and intersect to define a plurality of dummy areas; and the heat conducting layer includes a plurality of meshy structures arranged in an array and heat conducting wires connecting adjacent meshy structures, the plurality of meshy structures and the plurality of dummy areas are in one-to-one correspondence, each of the meshy structures is disposed in a corresponding dummy area, and an orthographic projection of the black matrix on the array substrate at least partially overlaps an orthographic projection of the meshy structures on the array substrate.

In some embodiments, both the first touch trace and the second touch trace are meshy metal wires.

In some embodiments, the touch layer further includes a first touch sensing structure and a second touch sensing structure; the first touch sensing structure is connected to the first touch trace and disposed on at least one side of the first touch trace; the second touch sensing structure is connected to the second touch trace and disposed on at least one side of the second touch trace; the first touch sensing structure and the second touch sensing structure are disposed at an intersection of the first touch trace and the second touch trace and insulated from each other; and at least part of an outline of an orthographic projection of the first touch sensing structure on the array substrate faces an outline of an orthographic projection of the second touch sensing structure on the array substrate.

In some embodiments, the heat conducting layer includes a titanium metal layer, an aluminum metal layer and an aluminium oxide layer laminated in sequence, and the aluminium oxide layer is in contact with the black matrix.

In some embodiments, the heat conducting layer is a transparent inorganic heat conducting material layer disposed in one of the following manners: the transparent inorganic heat conducting material layer is disposed between a layer where the black matrix is disposed and the OLED light-emitting layer in a direction perpendicular to the array substrate; and the layer where the black matrix is disposed is disposed between the transparent inorganic heat conducting material layer and the OLED light-emitting layer in the direction perpendicular to the array substrate.

In some embodiments, the transparent inorganic heat conducting material layer is an aluminium nitride layer.

In some embodiments, an orthographic projection of the heat conducting layer on the array substrate overlaps an orthographic projection of the black matrix on the array substrate; or an orthographic projection of the heat conducting layer on the array substrate is within an orthographic projection of the black matrix on the array substrate In another aspect, a display device is provided. The display device includes the display panel as described above.

In some embodiments, the display device further includes a heat dissipating layer and a heat conducting structure. The heat dissipating layer is disposed on a back side of the display panel. The heat conducting layer is connected to the heat dissipating layer through the heat conducting structure.

In some embodiments, the display device further includes a chip on film having a heat conducting area, wherein a part of the heat conducting area is attached to the heat conducting structure, and an other part of the heat conducting area is connected to the heat dissipating layer.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

A display device used outdoors, for example, a vehicle-mounted display, is generally exposed to direct sunlight. Under this situation, a color filter structure in the display device absorbs a lot of heat. Since a black matrix of the color filter structure absorbs heat more easily, the temperature at the black matrix rises sharply. The distance between the black matrix and an OLED light-emitting layer in the display device is relatively small, for example, 10 μm, so that the OLED light-emitting layer is easily affected by the high temperature at the black matrix, which shortens the service life of the OLED light-emitting layer. When the temperature rises from 25° C. to 45° C., the service life of the electroluminescent organic material in the OLED light-emitting layer shortens by about 70%.

Therefore, embodiments of the present disclosure provide a display panel. The color filter structure of the display panel can reduce heat transferred from the black matrix to the OLED light-emitting layer.

Figure 1:
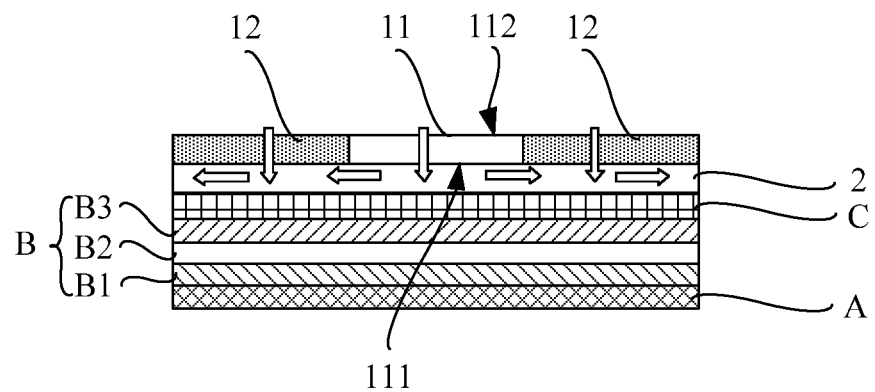
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel includes an array substrate A, an OLED light-emitting layer B and a color filter structure laminated in sequence.

The color filter structure includes a color filter layer 11, a black matrix 12, and a heat conducting layer 2. The color filter layer 11 and the black matrix 12 are disposed in the same layer. The heat conducting layer 2 is disposed on at least one side face of the black matrix 12 and configured to conduct heat from the black matrix 12 to the periphery of the color filter structure.

As shown by arrows in FIG. 1, heat conducted from the black matrix 12 to the heat conducting layer 2 spreads to the periphery of the heat conducting layer 2. In addition, in some examples, heat conducted from the color filter layer 11 to the heat conducting layer 2 also spreads to the periphery of the heat conducting layer 2.

Figure 2:
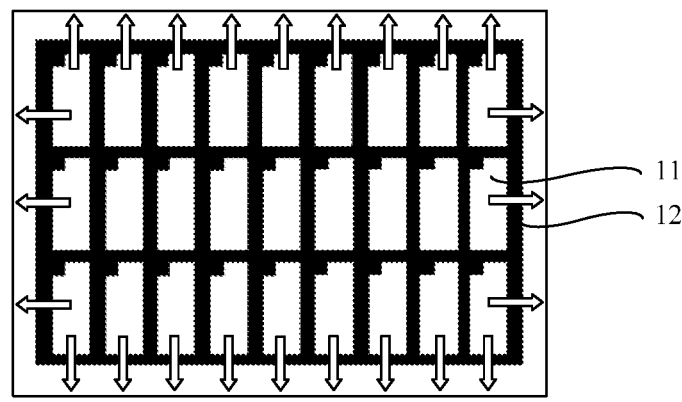
FIG. 2 is a schematic diagram of a heat transfer direction of a color filter structure according to an embodiment of the present disclosure.

FIG. 2 is a schematic diagram of a heat transfer direction of a color filter structure according to an embodiment of the present disclosure. As shown in FIG. 2, the black matrix 12 is meshy, and each void space (also called a mesh) in the meshy black matrix 12 corresponds to one sub-pixel. The heat transfer direction of the color filter structure in FIG. 2 is as shown by the arrows in the figure. Heat in the color filter structure spreads from the middle to the edge. That is, in the layer where the color filter structure is disposed, heat is conducted to the peripheral edge around the color filter structure, so as to be conducted to an edge area of the display panel for dissipation.

In the present embodiment, after the black matrix absorbs heat and heats up due to direct sunlight, the heat conducting layer disposed on one side face of the black matrix can absorb heat conducted from the black matrix and conduct the heat absorbed from the black matrix to the periphery of the color filter structure, so that most of the heat is conducted to the periphery of the color filter structure for dissipation. In this way, heat conducted from the black matrix to the OLED light-emitting layer below the black matrix greatly reduces, which helps prolong the service life of the electroluminescent organic material in the OLED light-emitting layer, thereby prolonging the service life of the display panel.

In the present embodiment, the array substrate A may also be referred to as a thin film transistor (TFT) substrate. The array substrate A includes a plurality of sub-pixel regions arranged in an array. Each sub-pixel region includes at least two TFTs configured to control the OLED light-emitting layer B to emit light. In an example, the array substrate A may include a base substrate, an active layer, a gate insulating layer, a gate metal layer, an interlayer dielectric layer, and a source/drain metal layer laminated in sequence.

In an example, the base substrate may be made from glass, quartz, plastic, or the like. The active layer may be made from amorphous silicon, polysilicon or a metal oxide semiconductor. The gate insulating layer may be made from silicon oxide, silicon nitride, silicon oxynitride, or the like. The gate metal layer may be a single-layer metal film of molybdenum, copper, titanium, etc., or a multi-layer metal film of molybdenum/aluminum/molybdenum or titanium/aluminum/titanium. The interlayer dielectric layer may be made from silicon oxide, silicon nitride, or the like. The source/drain metal layer may be a single-layer metal film of aluminum, molybdenum, copper, titanium, etc., or a multi-layer metal film of molybdenum/aluminum/molybdenum or titanium/aluminum/titanium.

It should be noted that a TFT with a single-layer gate metal layer is only used herein as an example to describe the hierarchical structure of the array substrate. In other embodiments, the array substrate may also adopt a TFT having such a structure as a double-layer gate metal layer. The hierarchical structure of the array substrate is not limited in the embodiments of the present disclosure.

In the present embodiment, as shown in FIG. 1, the OLED light-emitting layer B disposed on the array substrate A may include a plurality of light-emitting units arranged in an array. The OLED light-emitting layer B further includes a pixel define layer having a plurality of opening areas, and one light-emitting unit is correspondingly provided in each opening area.

Each light-emitting unit includes a first electrode layer B1, a display layer B2, and a second electrode layer B3. The first electrode layer B1 and the second electrode layer B3 may be one of an anode layer and a cathode layer, respectively. For example, the first electrode layer B1 is an anode layer, and the second electrode layer B3 is a cathode layer. For another example, the first electrode layer B1 is a cathode layer, and the second electrode layer B3 is an anode layer.

In an example, the display layer B2 may include a hole inject layer (HIL), a hole transport layer (HTL), an emission layer (EML), an electron transport layer (ETL), and an electron inject layer (EIL) laminated in sequence.

The cathode layer may be made from ITO, IZO, Ag, Mg:Ag, Al:Ag, Yb:Ag, or compositions thereof. The anode layer may be made from Al/ITO, ITO/Al/ITO, Ag/ITO, ITO/Ag/ITO, or the like. The hole inject layer may be made from CuPc, TiOPC, 2-TNATA, or the like. The hole transport layer may be made from aromatic amine, pyrazoline, or the like. The electron transport layer may be made from a coumarin derivative, a conjugated aromatic compound, or the like. The electron inject layer may be made from LiF, MgP, $MgF_2$, $Al_2O_3$, or the like. The emission layer may be made from Alq3, Almq3, TBADN, or the like.

In the present embodiment, the display layer is disposed between the anode layer and the cathode layer. After the array substrate A is powered, the anode layer releases holes, and the holes enter the emission layer through the hole inject layer and the hole transport layer sequentially. At the same time, the cathode layer releases electrons, and the electrons enter the emission layer through the electron inject layer and the electron transport layer sequentially. The electrons and the holes combine in the emission layer to make the emission layer emit light.

The electron inject layer/hole inject layer may reduce the potential barrier in injecting the electrons/holes from the cathode layer/anode layer, so that the electrons/holes may be effectively injected from the cathode layer/anode layer into the emission layer.

The electron transport layer/hole transport layer can control the transmission rate of electrons/holes. Since the transmission rate of holes is higher than that of electrons, the electrons and the holes may combine in the emission layer by reasonably controlling the transmission rates of the electrons and holes.

Optionally, the display layer may include an emission layer, as well as one or more of a hole inject layer, a hole transport layer, an electron transport layer, and an electron inject layer. It should be noted that the display layer at least includes the emission layer to meet the requirement of light emission.

In an embodiment of the present disclosure, the color filter layer 11 may include a plurality of color resist blocks of different colors arranged in an array, for example, a red color resist block, a green color resist block, a blue color resist block. Each color resist block corresponds to one sub-pixel. Light emitted from the OLED light-emitting layer, after passing through the color resist blocks of different colors, becomes light of the corresponding color and is emitted out.

In an example, the black matrix 12 is disposed between adjacent color resist blocks and may prevent the light emitted from the color resist blocks from being reflected to other color resist blocks, avoiding a decrease in the contrast of the display panel.

In the present embodiment, the color filter layer 11 and the black matrix 12 being disposed in the same layer may mean that the color filter layer 11 and the black matrix 12 are disposed on the same side of the same layer structure, or may mean that the surface of the color filter layer 11 and the surface of the black matrix 12 which are close to the base substrate are both in contact with the same layer structure, etc.

In some embodiments, the heat conducting layer 2 may be a meshy metal layer, and an area of the meshy metal layer corresponding to the color filter layer 11 is an opening area. Owing to excellent heat conductivity of metal, the heat conducting layer 2 made of metal has better heat conductivity, which facilitates heat dissipation of the heat conducting layer 2. In addition, the metal layer is designed into a meshy structure, so that light emitted from the OLED light-emitting layer B can pass through the heat conducting layer 2 to achieve a light-transmitting effect of the heat conducting layer.

The opening area may be a hollowed-out structure disposed in the meshy metal layer. For example, the hollowed-out structure may be a through hole, and each through hole corresponds to one sub-pixel in the color filter layer, or a plurality of through holes correspond to one sub-pixel in the color filter layer.

In an embodiment of the present disclosure, the black matrix 12 has a first side face, a second side face, and a third side face. The first side face faces the OLED light-emitting layer B. The first side face and the third side face are two opposite side faces of the black matrix 12. The second side face connects the first side face and the third side face, and the second side face faces the color filter layer 11.

In some examples, the heat conducting layer 2 is disposed on one side face of the black matrix 12, for example, the first side face or the third side face. In other examples, the heat conducting layer 2 is disposed on a plurality of side faces of the black matrix, for example, the first side face and the second side face.

In some embodiments, as shown in FIG. 1, the heat conducting layer 2 is disposed between a layer where the black matrix 12 is disposed and the OLED light-emitting layer B in a direction perpendicular to the array substrate A. Since the color filter layer 11 and the black matrix 12 are disposed in the same layer, the heat conducting layer 2 is disposed on the first side face 111 of the color filter layer 11 in the direction perpendicular to the array substrate A. The first side face 111 of the color filter layer 11 is a side face, which receives light emitted by the OLED light-emitting layer B, of the color filter layer 11. That is, the first side face 111 of the color filter layer 11 is a side face facing the OLED light-emitting layer B.

By disposing the heat conducting layer 2 between the OLED light-emitting layer B and the layer where the black matrix 12 is disposed, the black matrix 12 can be separated from the OLED light-emitting layer B. In this way, after the black matrix 12 absorbs lots of heat, the heat is conducted to the OLED light-emitting layer B in the first time due to the isolation by the heat conducting layer 2, thereby reducing the heat absorbed by the OLED light-emitting layer B. Moreover, when the heat conducting layer 2 is a meshy metal layer, at least part of the meshy metal layer is disposed between the layer where the black matrix 12 is disposed and the OLED light-emitting layer B, so that ambient light reflected on the meshy metal layer can be reduced under the shield of the black matrix 12, thereby improving the display effect of the display panel.

Optionally, an orthographic projection of the heat conducting layer 2 on the array substrate A overlaps an orthographic projection of the black matrix 12 on the array substrate A, or the orthographic projection of the heat conducting layer 2 on the array substrate A is within the orthographic projection of the black matrix 12 on the array substrate A.

The relationship between the orthographic projection of the heat conducting layer 2 and the orthographic projection of the black matrix 12 indicates that the heat conducting layer 2 may only correspond to the black matrix 12, and an area corresponding to the color filter layer 11 is an opening area. In the present embodiment, in the color filter structure, the black matrix 12 absorbs heat and heats up more easily than the color filter layer 11. Therefore, the heat conducting layer 2 and the black matrix 12 are arranged facing each other, which helps conduct heat away from the area with a relatively high temperature on the color filter structure, to dissipate heat quickly. In addition, since the opening area on the heat conducting layer 2 faces the color filter layer 11, the heat conducting layer 2 can be prevented from shielding the color filter layer 11, which helps improve the light-emitting efficiency.

Figure 3:
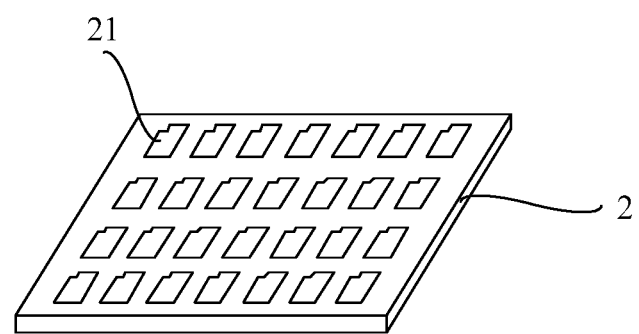
FIG. 3 is a schematic structural diagram of a heat conducting layer according to an embodiment of the present disclosure.

In an example, FIG. 3 is a schematic structural diagram of a heat conducting layer according to an embodiment of the present disclosure. As shown in FIG. 3, the heat conducting layer 2 is a metal layer. The metal layer includes a plurality of light-transmitting holes 21 arranged at intervals, so that the heat conducting layer 2 is formed as a meshy metal layer. The light-transmitting holes 21 and sub-pixel regions are the same in shape and area. The light-transmitting hole 21 is the aforementioned opening area facing the color filter layer 11. The heat conducting layer 2 is simple in structure and easy to manufacture.

As shown in FIGS. 2 and 3, the orthographic projection of the heat conducting layer 2 on the array substrate A may overlaps the orthographic projection of the black matrix 12 on the array substrate A. That is, portions, except the light-transmitting holes 21, of the heat conducting layer 2 are opaque and completely overlap the black matrix 12, so that each portion of the black matrix 12 may be attached to and in contact with the heat conducting layer 2 to fully conduct the heat out from the black matrix 12. In addition, the light-transmitting holes 21 in the heat conducting layer 2 face the color filter layer 11, so that the color filter structure has a better light-transmitting effect, and the light-emitting effect of the display panel can be improved.

In some other examples, the portion, facing the black matrix 12, of the heat conducting layer 2 is non-opaque. Optionally, the portion, facing the black matrix 12, of the heat conducting layer 2 may be meshy metal wires. That is, the portion, facing the black matrix 12, of the heat conducting layer 2 also has hollowed-out structures.

It should be noted that in other embodiments, the orthographic projection of the heat conducting layer 2 on the array substrate A may also go beyond the orthographic projection area of the black matrix 12 on the array substrate A as long as the display function of the display panel works normally.

Figure 4:
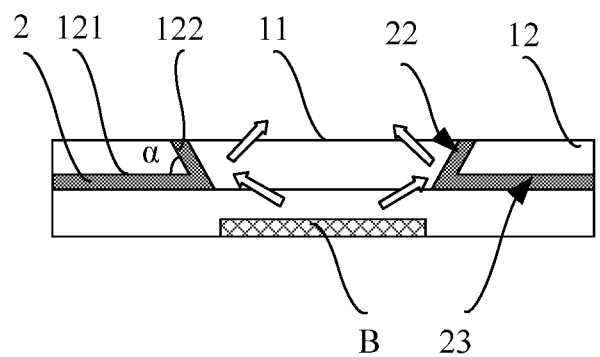
FIG. 4 is a schematic structural diagram of a color filter structure according to an embodiment of the present disclosure.

FIG. 4 is a schematic structural diagram of a color filter structure according to an embodiment of the present disclosure. As shown in FIG. 4, the black matrix 12 includes a first side face 121 facing the OLED light-emitting layer B and a second side face 122 facing the color filter layer 11. The first side face 121 and the second side face 122 are connected to each other. The heat conducting layer 2 includes a reflecting portion 22 and a heat conducting portion 23 connected to each other. The heat conducting portion 23 is disposed on the first side face 121 of the black matrix 12, and the reflecting portion 22 is disposed on the second side face 122 of the black matrix 12.

In FIG. 4, the heat conducting portion 23 is disposed between the OLED light-emitting layer B and the black matrix 12 and the heat conducting portion 23 is attached to the first side face 121 of the black matrix 12 to conduct heat. The reflecting portion 22 is disposed between the black matrix 12 and the color filter layer 11. The color filter layer 11 is an area for light transmission in the color filter structure. The reflecting portion 22 is disposed between the color filter layer 11 and the black matrix 12, so that the reflecting portion 22 can, by means of the reflectivity of metal, reflect light emitted by the OLED light-emitting layer B, and change the light emitting route. The reflecting portion 22 can converge light emitted from the same light-emitting unit, to improve the light-emitting efficiency of the display panel improve the luminance in different viewing angles, and solve the problem of light attenuation.

Optionally, an angle between a plane where the reflecting portion 22 is disposed and a plane where the heat conducting portion 23 is disposed ranges from 70° to 110°.

In an example, as shown in FIG. 4, two opposite surfaces of the reflecting portion 22 are both parallel to the plane where the reflecting portion 22 is disposed, and two opposite surfaces of the heat conducting portion 23 are both parallel to the plane where the heat conducting portion 23 is disposed. The surface, facing the color filter layer 11, of the reflecting portion 22 is taken as the first surface of the reflecting portion 22, and the surface, facing the OLED light-emitting layer B, of the heat conducting portion 23 is taken as the first surface of the heat conducting portion 23. An angle between the first surface of the reflecting portion 22 and the first surface of the heat conducting portion 23 equals the angle between the plane where the reflecting portion 22 is disposed and the plane where the heat conducting portion 23 is disposed.

In an example, the angle α between the plane where the reflecting portion 22 is disposed and the plane where the heat conducting portion 23 is disposed in FIG. 4 is 70°. As shown by arrows in FIG. 4, light emitted from one light-emitting unit in the OLED light-emitting layer B is reflected by the reflecting portion 22 and then is emitted from the color filter layer 11. Light which originally irradiates on the black matrix 12 is reflected and emits from the color filter layer 11, so that the light-emitting efficiency of the OLED light-emitting layer B can be improved. In addition, light emitted from the color filter layer 11 concentrates in a position corresponding to the middle of the color filter layer 11 on one side of the display panel, so that the luminance of emitting light viewed from the direction facing the color filter layer 11 may be improved.

Figure 5:
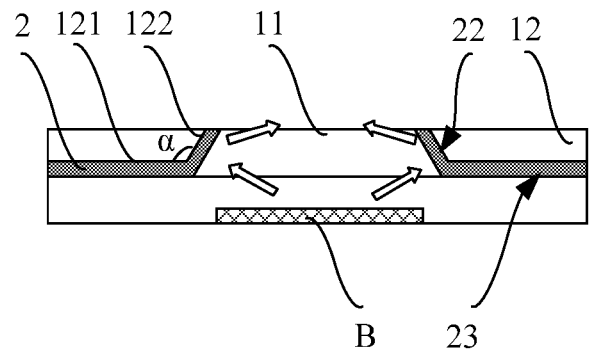
FIG. 5 is a schematic structural diagram of a color filter structure according to an embodiment of the present disclosure.

In an example, as shown in FIG. 5, the angle α between the plane where the reflecting portion 22 is disposed and the plane where the heat conducting portion 23 is disposed is 110°. As shown by arrows in FIG. 5, light emitted from one light-emitting unit in the OLED light-emitting layer B is reflected by the reflecting portion 22 and then is emitted from the color filter layer 11. The light originally incident onto the black matrix 12 is reflected and emits from the color filter layer 11, so that the light-emitting efficiency of the OLED light-emitting layer B can be improved. In addition, the light emitted from the color filter layer 11 tends to diverge from the middle of the color filter layer 11 to the side edge, on one side of the display panel, so that the luminance of emitting light viewed from the direction of laterally viewing the color filter layer 11 can be improved.

In some embodiments, the OLED light-emitting layer B, the layer where the black matrix 12 is disposed, and the heat conducting layer 2 may be sequentially laminated on the array substrate. In this case, the heat conducting layer 2 is disposed on the third side face of the black matrix 12 and is disposed on the second side face 112 of the color filter layer 11. The second side face 112 of the color filter layer 11 is a side face of the color filter layer 11 opposite to the first side face 111.

In this embodiment, the heat conducting layer 2 still faces the black matrix 12. Therefore, when the black matrix 12 absorbs a lot of heat, the heat conducting layer 2 may still absorb a lot of heat in the black matrix 12 and conduct the heat to the periphery of the color filter structure. Thus, the heat transferred to the OLED light-emitting layer B is reduced.

In some embodiments, the display panel may further include a touch layer 3. The heat conducting layer 2 and the touch layer 3 are disposed in the same layer and insulated from each other.

The heat conducting layer 2 and the touch layer 3 being disposed in the same layer means that the heat conducting layer 2 and the touch layer 3 are disposed on the same side of the same layer structure, or means that the surface of the heat conducting layer 11 and the surface of the touch layer 12 which are close to the base substrate are both in contact with the same layer structure, or means that the heat conducting layer 2 and the touch layer 3 are formed by one patterning process.

In the present embodiment, the heat conducting layer 2 may face the black matrix in the color filter structure to facilitate heat dissipation from the black matrix. In addition, the heat conducting layer 2 is insulated from the touch layer 3, so that the heat conducting layer 2 does not affect the touch function of the touch layer 3.

When the touch layer and the heat conducting layer are disposed in the same layer, an insulating layer may be provided between the OLED light-emitting layer B and the heat conducting layer 2 as an encapsulation layer C (shown in FIG. 1) to facilitate production of the touch layer on the encapsulation layer C. That is, the touch layer is fabricated on the outer side of the encapsulation layer C of the OLED display panel.

In an example, the touch layer 3 is implemented with the flexible multi-layer on cell (FMLOC) technology. In the FMLOC technology, the touch layer is formed by fabricating metal meshes on the encapsulation layer C. The metal meshes are formed by a plurality of metal wires, and the width of the metal wire in the metal meshes is less than 4 μm. Due to the small width, even if the touch layer is disposed in a sub-pixel region, light emitted from the sub-pixel region can still pass through the touch layer without affecting normal display of the display panel.

In some embodiments, a plurality of grids in the metal meshes may correspond to the same sub-pixel region. That is, both the metal wires and the grids of the metal meshes may correspond to the positions where the color filter layer 11 and the black matrix 12 are disposed.

In some embodiments, a single grid in the metal meshes may correspond to one sub-pixel region. That is, the grids of the metal meshes correspond to the position where the color filter layer 11 is disposed, and the metal wires of the metal meshes correspond to the position where the black matrix 12 is disposed.

Figure 6:
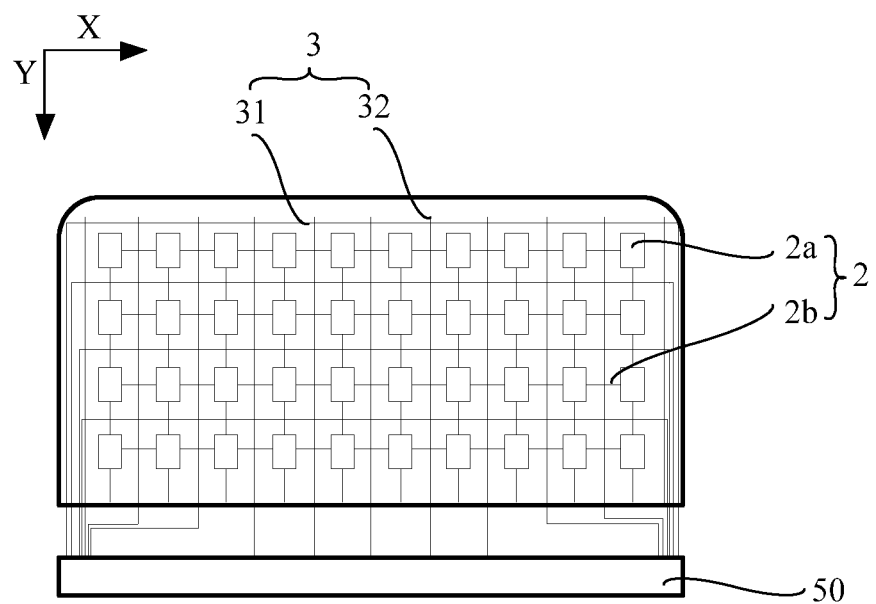
FIG. 6 is a schematic structural diagram of a touch screen panel according to an embodiment of the present disclosure.

FIG. 6 is a schematic structural diagram of a touch screen panel according to an embodiment of the present disclosure. As shown in FIG. 6, the touch layer 3 implemented with the FMLOC technology may include a plurality of first touch traces 31 and a plurality of second touch traces 32. The first touch traces 31 and the second touch traces 32 are insulated from each other. The first touch traces 31 and the second touch traces 32 intersect to define a plurality of dummy areas. The heat conducting layer 2 includes a plurality of meshy structures 2a arranged in an array and heat conducting wires 2b connecting adjacent meshy structures 2a. The plurality of meshy structures 2a and the plurality of dummy areas are in one-to-one correspondence, and each meshy structure 2a is disposed in the corresponding dummy area.

The meshy structure 2a may be a mesh-shaped structure formed by intersecting a plurality of stripe-shaped structures.

In an example, as shown in FIG. 6, the plurality of first touch traces 31 may extend in a first direction X and may be parallelly arranged at intervals, and the second touch traces 32 may extend in a second direction Y and may be parallelly arranged at intervals. The first touch traces 31 and the second touch traces 32 intersect to define a plurality of dummy areas. The second touch trace 32 is provided between two adjacent meshy structures 2a in the first direction X, and the first touch trace 31 is provided between two adjacent meshy structures 2a in the second direction Y.

Figure 7:
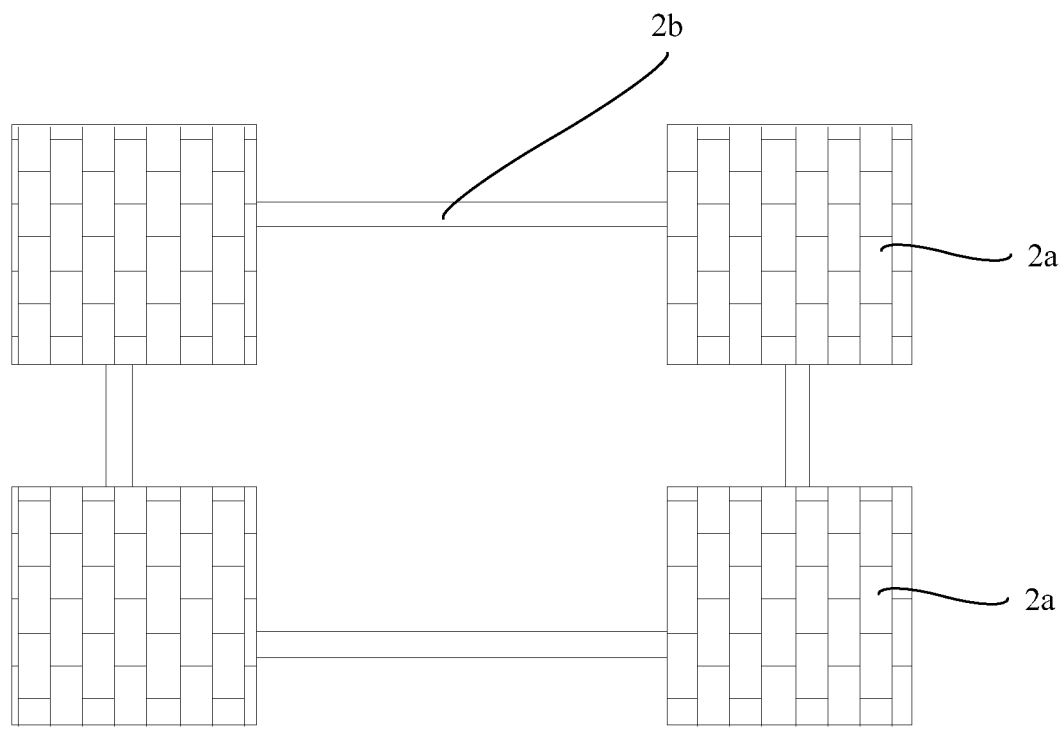
FIG. 7 is a schematic diagram of a microstructure of a meshy structure according to an embodiment of the present disclosure.

FIG. 7 is a schematic diagram of a microstructure of a meshy structure according to an embodiment of the present disclosure. With reference to FIGS. 6 and 7, each meshy structure 2a includes a plurality of metal wires connected in a crossed fashion. The plurality of meshy structures 2a is connected via heat conducting wires 2b to form a heat conducting net so as to facilitate heat transfer among different meshy structures 2a. Some of the heat conducting wires 2b extend in the first direction X and the other the heat conducting wires 2b extend in the second direction Y, to connect the meshy structures 2a. The first direction X and the second direction Y are perpendicular to each other. Since all the meshy structures 2a are connected via the heat conducting wires 2b, the meshy structure 2a distributed in the middle of the touch screen panel can also conduct heat to the periphery of the touch screen panel through connection by the heat conducting wire 2b.

It should be noted that in the present embodiment, when the heat conducting layer 2 is a meshy metal layer and disposed in the same layer as the touch layer 3, the heat conducting layer 2 is part of the metal meshes in the FMLOC technology. In this case, the metal meshes in the FMLOC technology include a large number of dummy metal wires, and the dummy wires do not need to be powered during use. The meshy structures 2a are formed by the dummy metal wires. In the present embodiment, a large number of dummy metal wires that do not play a touch role in the metal meshes of the FMLOC technology are connected via the heat conducting wires 2b to form a heat conducting net, to facilitate heat conduction from the black matrix 12. By dividing the metal mesh into two parts, namely the heat conducting layer 2 and the touch layer 3, every part of the metal mesh can be fully utilized and the cost is lowered.

In the present embodiment, metal wires, except dummy metal wires, in the metal meshes form the first touch traces 31 and the second touch traces 32, which need to be powered to implement touch.

One of the first touch trace 31 and the second touch trace 32 may be a metal trace configured to receive a touch sensing signal, and the other one may be a metal trace configured to send a touch drive signal. The metal trace configured to receive the touch sensing signal may be used as a sensing electrode, and the metal trace configured to send the touch drive signal may be used as a drive electrode. When the first touch trace 31 and the second touch trace 32 intersect, opposite areas of the first touch trace 31 and the second touch trace 32 which form capacitance. In this way, when a hand touches a screen, the capacitance at the hand-touched position changes, and the touch screen may determine the hand-touched position based on the change of the capacitance.

Figure 8:
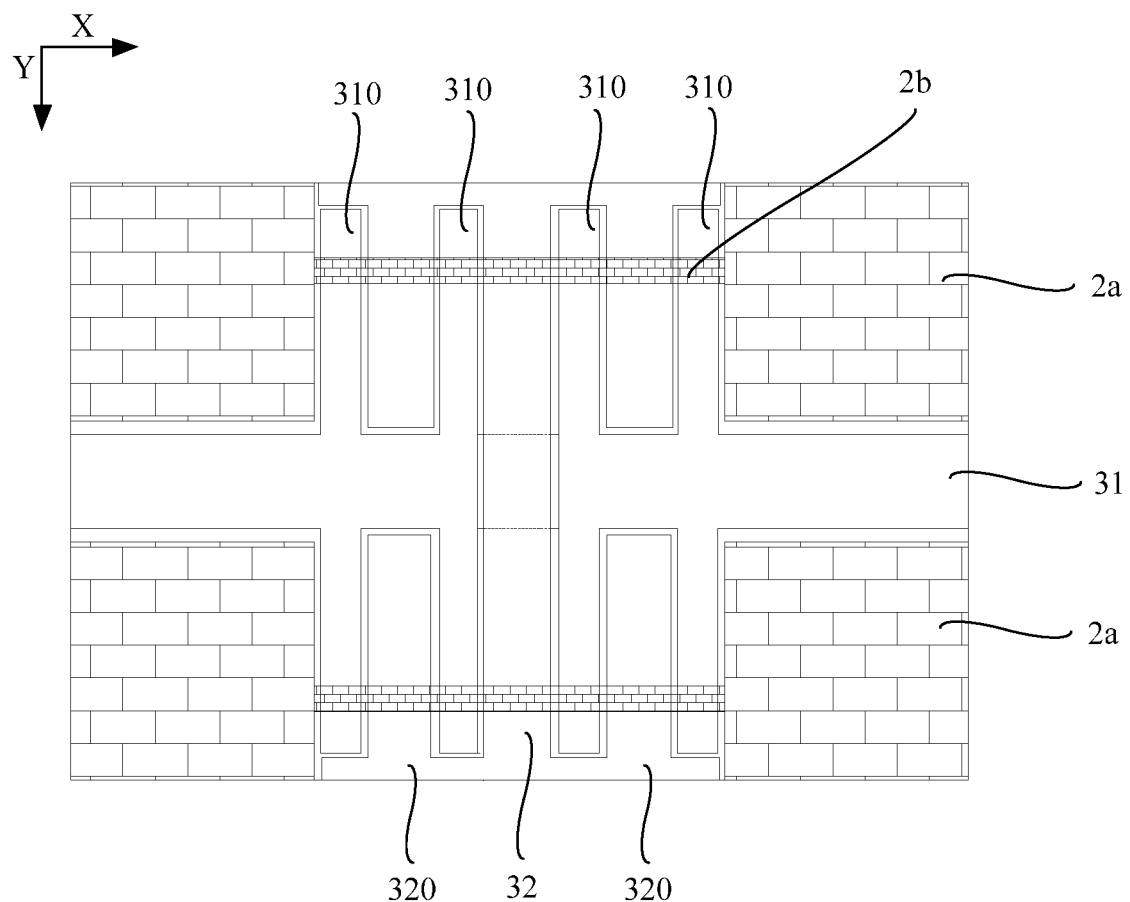
FIG. 8 is a schematic diagram of a partial structure of a touch screen panel according to an embodiment of the present disclosure.
Figure 9:
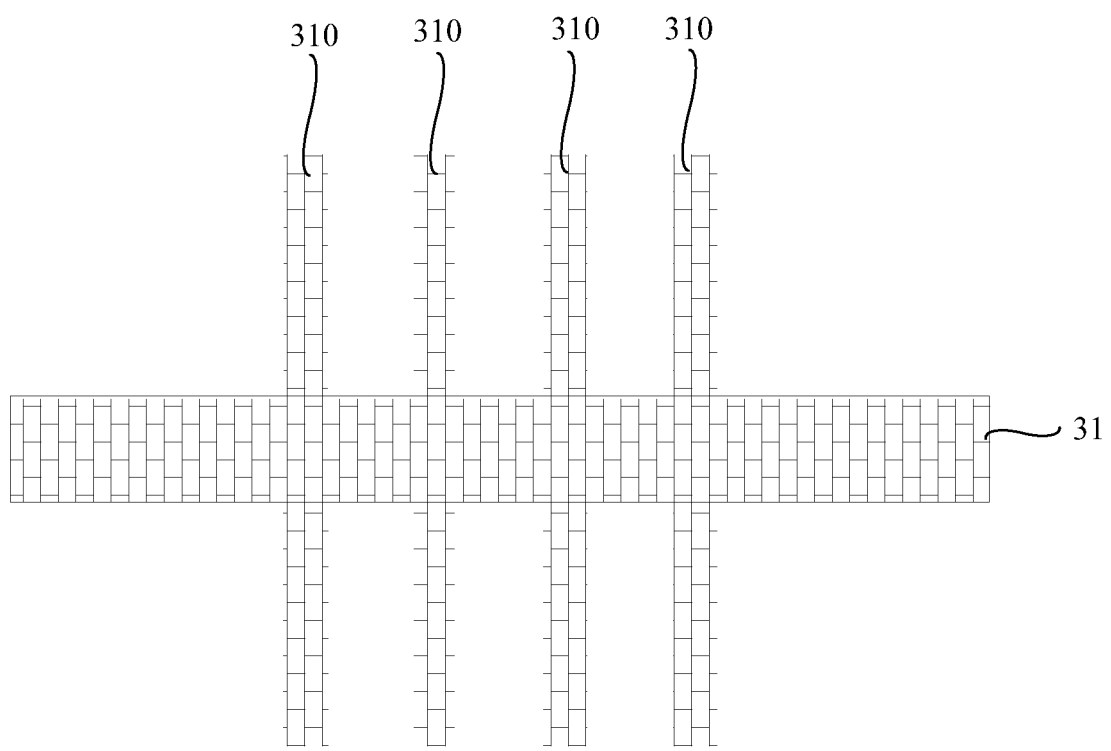
FIG. 9 is a schematic microscopic diagram of a first touch trace according to an embodiment of the present disclosure.
Figure 10:
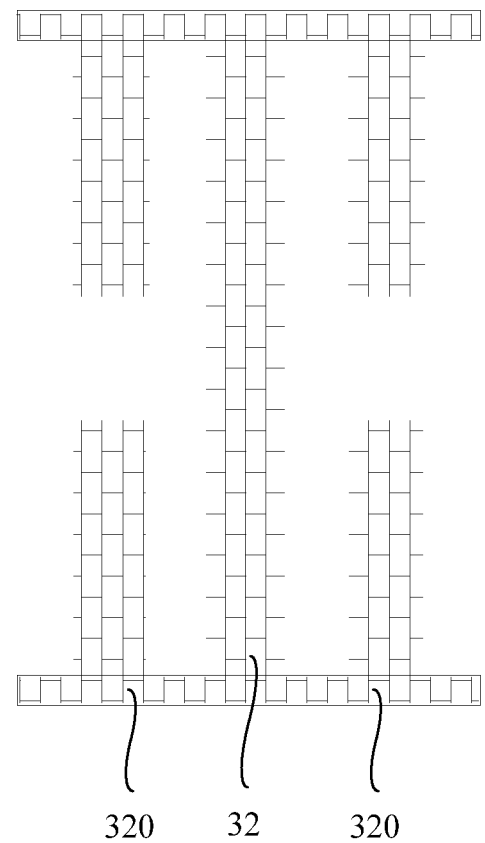
FIG. 10 is a schematic microscopic diagram of a second touch trace according to an embodiment of the present disclosure.

FIG. 8 is a schematic diagram of a partial structure of a touch screen panel according to an embodiment of the present disclosure. FIG. 9 is a schematic microscopic diagram of a first touch trace according to an embodiment of the present disclosure. FIG. 10 is a schematic microscopic diagram of a second touch trace according to an embodiment of the present disclosure. As shown in FIGS. 8-10, both the first touch trace 31 and the second touch trace 32 are meshy metal wires. Grid portions of the first touch trace 31 and the second touch trace 32 correspond to the position of the color filter layer 11 in the color filter structure. Meshes in the metal wires are used to transmit light, to facilitate light emission from the display panel.

Optionally, as shown in FIGS. 8 to 10, the touch layer 3 further includes a first touch sensing structure 310 and a second touch sensing structure 320. The first touch sensing structure 310 is connected to the first touch trace 31 and disposed on at least one side of the first touch trace 31. The second touch sensing structure 320 is connected to the second touch trace 32 and disposed on at least one side of the second touch trace 32. The first touch sensing structure 310 and the second touch sensing structure 320 are disposed at the intersection of the first touch trace 31 and the second touch trace 32 and are insulated from each other. At least part of the outline of an orthographic projection of the first touch sensing structure 310 on the array substrate A faces the outline of an orthographic projection of the second touch sensing structure 320 on the array substrate A. In this way, opposite parts between the first touch trace 31 and the second touch trace 32 include opposite regions between the first touch sensing structure 310 and the second touch sensing structure 320 in addition to the intersection of the first touch trace 31 and the second touch trace 32, so that the area of the opposite parts between the first touch trace 31 and the second touch trace 32 increase, thereby increasing the capacitance between the first touch trace 31 and the second touch trace 32, and improving the touch sensitivity.

In an example, as shown in FIG. 8, at least part of the outline of the orthographic projection of the first touch sensing structure 310 on the array substrate A faces the outline of the orthographic projection of the second touch sensing structure 320 on the array substrate A, and the first touch sensing structure 310 and the second touch sensing structure 320 together form a finger-crossed structure, to increase the area of opposite parts between the first touch trace 31 and the second touch trace 32.

In an example, as shown in FIGS. 8 and 9, a plurality of first touch sensing structures 310 extending in the second direction Y are provided on both sides of the first touch trace 31. With reference to FIG. 9, it can be known that the first touch sensing structure 310 is a stripe-shaped meshy metal structure, and the plurality of meshy metal structures are parallelly arranged at intervals. As shown in FIGS. 8 and 10, a plurality of second touch sensing structures 320 extending in the first direction X are provided on both sides of the second touch trace 32. It can be known with reference to FIG. 10 that the second touch sensing structure 320 is a stripe-shaped meshy metal structure, and the plurality of meshy metal structures are parallelly arranged at intervals.

Moreover, as shown in FIGS. 8 and 10, the second touch sensing structures 320 connected by the second touch traces 32 may also extend in an appropriate position along the second direction Y, so that the second touch sensing structures 320 may fill the gaps between the plurality of first touch sensing structures 310 of the first touch traces 31. In this way, the first touch sensing structures 310 and the second touch sensing structures 320 together form a finger-crossed structure.

Since the first touch trace 31 and the second touch trace 32 are insulated from each other, the first touch trace 31 and the second touch trace 32 also needs to be insulated at the intersection thereof. In the present embodiment, at the intersection of the first touch trace 31 and the second touch trace 32, one of the first touch trace 31 and the second touch trace 32 is connected in a cross-layer fashion through a conductive layer, so that the first touch trace 31 and the second touch trace 32 is prevent against contact at the intersection to cause a short circuit.

Figure 11:
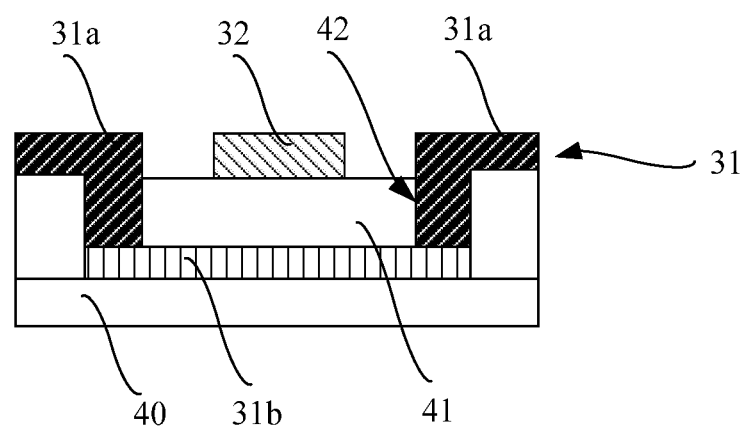
FIG. 11 is a schematic diagram of a hierarchical structure of a first touch trace and a second touch trace according to an embodiment of the present disclosure.

FIG. 11 is a schematic diagram of a hierarchical structure of a first touch trace and a second touch trace according to an embodiment of the present disclosure. As shown in FIG. 11, the first touch trace 31 includes a plurality of sub-traces 31a spaced apart and a connecting portions 31b connecting the adjacent sub-traces 31a. The connecting portions 31b are connected to the corresponding sub-traces 31a through via holes. The second touch trace 32 and the sub-traces 31a are disposed in the same layer. At the intersection of the first touch trace 31 and the second touch trace 32, the second touch trace 32 is disposed between the two adjacent sub-traces 31a and the sub-traces 31a are insulated from the second touch trace 32.

In the present embodiment, the connecting portion 31b may be made of metal. As shown in FIG. 11, first, a barrier layer 40 is formed on the encapsulation layer of the OLED display panel. The barrier layer 40 is configured to isolate the encapsulation layer from the touch layer and the barrier layer 40 may be made from silicon oxide. Next, a metal layer is provided on the barrier layer 40. The metal layer includes the connecting portion 31b. An insulating layer which may be an interlayer dielectric (ILD) layer 41 is formed on the metal layer. The first touch trace 31 and the second touch trace 32 are disposed above the interlayer dielectric layer 41. The second touch trace 32 passes through the gap between two adjacent sub-traces 31a in the first touch trace 31, so that the sub-traces 31a of the first touch trace 31 are insulated from the second touch trace 32. The two adjacent sub-traces 31a are connected by the connecting portion 31b, so that the first touch trace 31 bypasses the second touch trace 32 at the intersection by means of wire changing. Therefore, the first touch trace 31 and the second touch trace 32 are insulated from each other.

In some embodiments, at the intersection of the first touch trace and the second touch trace, each second touch trace may include a plurality of sub-traces arranged at intervals and connecting portions connecting two adjacent sub-traces. The first touch trace is disposed between two adjacent sub-traces of the second touch trace, so that the sub-traces of the second touch trace are insulated from the first touch trace. By providing the connecting portion at the intersection to connect the two adjacent sub-traces, the second touch trace can bypass the first touch trace at the intersection by means of wire changing, to realize insulation between the first touch trace and the second touch trace.

It should be noted that as shown in FIG. 8, in some examples, the heat conducting wire 2b intersects the first touch sensing structure 310 and the second touch sensing structure 320. In order to prevent the heat conducting wire 2b from affecting the touch function, the heat conducting wire 2b needs to be insulated from both the first touch sensing structure 310 and the second touch sensing structure 320.

In some embodiments, both the heat conducting wire 2b and the meshy structure 2a are part of the metal meshes. The first touch sensing structure 310 is divided into two sub-structures on two sides of the heat conducting wire 2b. The two sub-structures are connected by a conductive layer in a cross-layer fashion. The cross-layer connection fashion of the sub-structures is similar to the aforementioned cross-layer connection of the sub-traces.

In some embodiments, the heat conducting wire 2b and the metal meshes are disposed in different layers, and the heat conducting wire 2b connects two adjacent meshy structures 2a in a cross-layer fashion to insulate the first touch sensing structure 310 from the second touch sensing structure 320.

Figure 12:
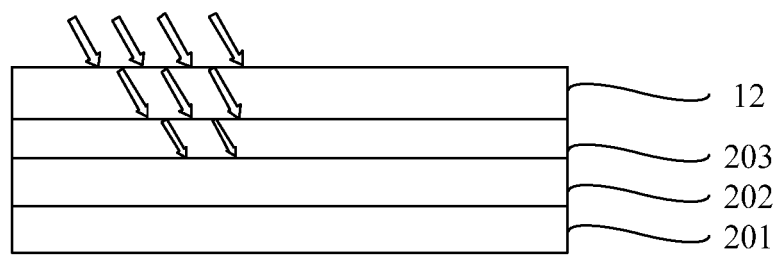
FIG. 12 is a schematic structural diagram of a heat conducting layer according to an embodiment of the present disclosure.

FIG. 12 is a schematic structural diagram of a heat conducting layer according to an embodiment of the present disclosure. As shown in FIG. 12, the heat conducting layer 2 includes a titanium metal layer 201, an aluminum metal layer 202, and an aluminum oxide layer 203 laminated in sequence. The aluminum oxide layer 203 is in contact with the black matrix 12. With reference to the light path direction indicated by arrows in FIG. 12, it can be known that external light reaches the aluminum oxide layer 203 after passing through the black matrix 12. The reflectivity of $Al_2O_3$ is only 7%, and the aluminum oxide layer 203 has a certain thickness. Therefore, the external light weakens in intensity after passing through the aluminum oxide layer 203, which greatly reduces light reflection of the black matrix 12 and the heat conducting layer 2. The black matrix 12 partially plays a role of reducing reflection of external light on a screen, and the thicker the black matrix 12 is, the better effect of reducing the reflection is. In the present embodiment, since the heat conducting layer 2 having the aluminum oxide layer 203 is provided under the black matrix 12, the black matrix 12 may be appropriately thinned.

Meanwhile, a layer, facing away from the black matrix 12, in the heat conducting layer 2 is provided as a titanium metal layer 201, the reflectivity of the heat conducting layer 2 can be improved. Since the reflecting portion 22 of the heat conducting layer 2 needs to reflect light emitted from the display panel, providing the titanium metal layer 201 can improve the light-emitting efficiency of the display panel and improve the luminance of light emitted from the color filter layer 11 in different viewing directions.

If it is necessary to externally attach a touch screen panel (TSP) onto the display panel, or FMLOC is unavailable, a heat conducting layer formed by a large number of metal wires cannot be provided between the layer where the black matrix is disposed and the OLED light-emitting layer. Otherwise, signals of the touch screen panel are shielded. Therefore, in some embodiments, the heat conducting layer 2 is a transparent inorganic heat conducting material layer, to avoid affecting the externally attached touch screen panel.

Optionally, the transparent inorganic heat conducting material layer is disposed between the layer where the black matrix 12 is disposed and the OLED light-emitting layer B; or, the layer where the black matrix 12 is disposed is disposed between the transparent inorganic heat conducting material layer and the OLED light-emitting layer B. That is, the transparent inorganic heat conducting material layer may be disposed on the first side face 111 of the color filter layer 11 or on the second side face 112 of the color filter layer 11.

The transparent inorganic heat conducting material layer is a highly heat conductive and non-conducting material layer, for example, an aluminum nitride (AlN) layer. The heat conductivity coefficient of the transparent inorganic heat conducting material layer may reach 175 W/(m·k), and the heat conductivity is equivalent to that of metal. Thus, the transparent inorganic heat conducting material layer has a favorable heat-conducting effect.

Figure 13:
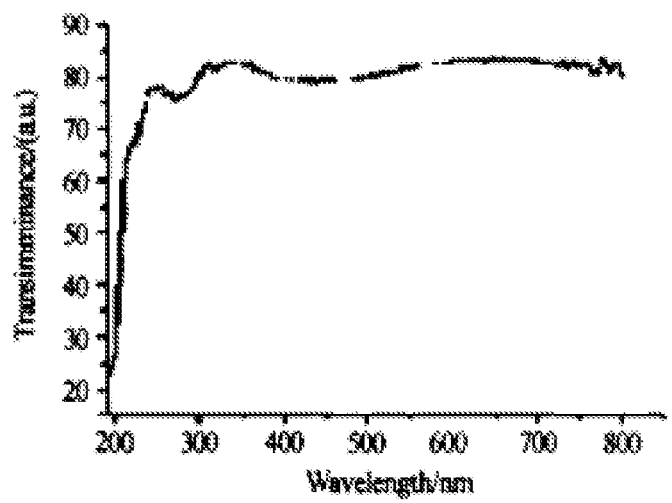
FIG. 13 is a schematic diagram of transmittance of aluminium nitride to light of different wavelengths according to an embodiment of the present disclosure.

FIG. 13 is a schematic diagram of transmittance of aluminium nitride to light of different wavelengths according to an embodiment of the present disclosure. As shown in FIG. 13, the transmittance of AlN to light with a wavelength of 250 nm to 800 nm is relatively high, up to 80%. In addition, the reflectivity of AlN to light within the wavelength range of 250 nm to 800 nm is relatively low, so the AlN layer is arranged on the color filter layer 11, i.e., on the first side face 111 of the color filter layer 11.

Figure 14:
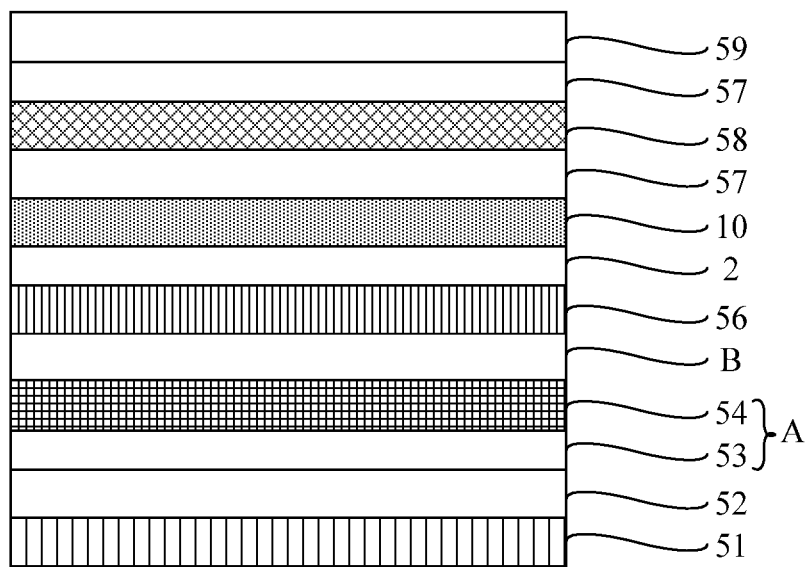
FIG. 14 is a schematic structural diagram of a display panel according to an embodiment of the present disclosure.

FIG. 14 is a schematic structural diagram of a display panel according to an embodiment of the present disclosure. As shown in FIG. 14, the display panel includes a bottom film 52, an array substrate A, an OLED light-emitting layer B, an encapsulation film 56, a heat conducting layer 2 (AlN layer), a layer 10 where the black matrix is disposed, an optical adhesive layer 57, a touch screen panel 58, an optical adhesive layer 57 and a cover plate 59 laminated in sequence from bottom to top. The display panel adopts an externally attached touch screen panel, and the AlN layer is provided below the layer where the black matrix is disposed. Owing to the high heat conductivity and the non-conductive property of the AlN layer, the heat conducting layer 2 can play a favorable heat-conducting effect.

Figure 15:
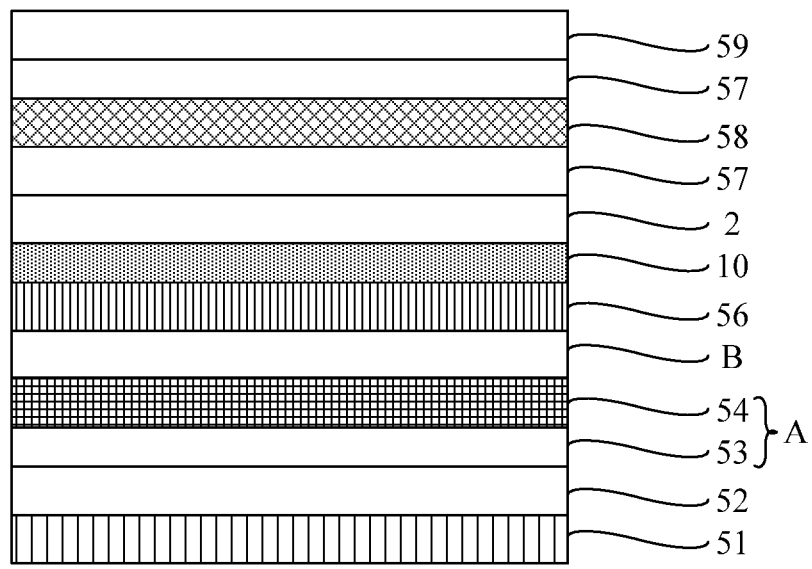
FIG. 15 is a schematic structural diagram of a display panel according to an embodiment of the present disclosure.

FIG. 15 is a schematic structural diagram of a display panel according to an embodiment of the present disclosure. As shown in FIG. 15, the display panel includes a bottom film 52, an array substrate A, an OLED light-emitting layer B, an encapsulation film 56, a layer 10 where the black matrix is disposed, a heat conducting layer 2 (AlN layer), an optical adhesive layer 57, a touch screen panel 58, an optical adhesive layer 57 and a cover plate 59 laminated in sequence from bottom to top.

The display panel adopts an externally attached touch screen panel, and the AlN layer is provided on the layer where the black matrix is disposed. Owing to the highly heat conductivity and the non-conductive property of the AlN layer, the heat conducting layer 2 can play a favorable heat-conducing effect.

In the embodiments shown in FIGS. 14 and 15, the array substrate A includes a polyimide film 53 and a TFT array structure 54. In an example, the array substrate A is a low-temperature polysilicon array substrate. In some examples, the polyimide film 53 is a base substrate. In an example, the TFT array structure 54 includes an active layer, a gate insulating layer, a gate metal layer, an interlayer dielectric layer, a source/drain metal layer and the like.

Figure 16:
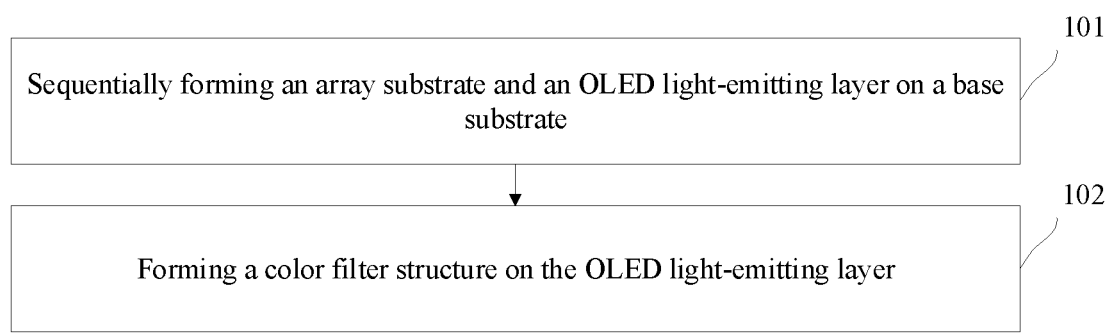
FIG. 16 is a flow chart of a method for preparing a color filter structure according to an embodiment of the present disclosure.

FIG. 16 is a flow chart of a method for preparing a display panel according to an embodiment of the present disclosure. The method is applicable to prepare the color filter structure as described above. As shown in FIG. 16, the method includes the following steps.

In step 101, an OLED light-emitting layer is formed on an array substrate.

The processes for forming the array substrate may include film formation, exposure, developing, etching, and stripping.

The processes for forming the OLED light-emitting layer may include sequentially forming a first electrode layer, a display layer and a second electrode layer on the array substrate. The first electrode layer and the second electrode layer are one of an anode layer and a cathode layer, respectively. The display layer may be formed by a vapor deposition process and may include an emission layer, as well as one or more of a hole inject layer, a hole transport layer, an electron transport layer, and an electron inject layer.

In step 101, after the OLED light-emitting layer is formed, it is necessary to form an encapsulation layer on the OLED light-emitting layer, so that other film layers can be prepared on the outer side of the encapsulation layer in subsequent steps.

In step 102, a color filter structure is formed on the OLED light-emitting layer.

The color filter structure includes a color filter layer, a black matrix, and a heat conducting layer. The color filter layer and the black matrix are disposed in the same layer. The heat conducting layer is disposed on a side face of the black matrix and configured to conduct heat from the black matrix to the periphery of the color filter structure.

Step 102 may include the following sub-steps.

In a first sub-step, a color filter layer is formed on the OLED light-emitting layer.

In the first sub-step, a plurality of color resist blocks arranged in an array may be formed on a base substrate by using a photoetching process to obtain the color filter layer.

The color resist blocks may be of different colors, and for example, may include a red color resist block, a green color resist block, a blue color resist block, and the like. Light of different colors may be filtered out when the light passes through the color resist blocks of different colors.

During formation of the color filter layer, the angle between the reflecting portion and the heat conducting portion of the heat conducting layer need to be considered, so as to determine the shape of the color filter layer to be prepared. For example, when the angle between the reflecting portion and the heat conducting portion of the heat conducting layer is less than 90°, the color resist block in the color filter layer is in a shape of an inverted trapezoid (see FIG. 4), to facilitate attachment between the reflecting portion and the color filter layer. For another example, when the angle between the reflecting portion and the heat conducting portion of the heat conducting layer is greater than 90°, the color resist block in the color filter layer is in a shape of a regular trapezoid (see FIG. 5) to facilitate attachment between the reflecting portion and the color filter layer.

In a second sub-step, a heat conducting layer is formed in a gap area in the color filter layer.

The gap area of the color filter layer is a gap between the plurality of color resist blocks.

The second sub-step may include: forming a metal layer in the gap area of the color filter layer by a sputtering process, and the metal layer may also be disposed on the side face of the color filter layer in addition to filling the gap area of the color filter layer, to form the reflecting portion that forms an angle with the heat conducting portion.

Then, patterns are formed on the metal layer with a mask by a patterning process to acquire the heat conducting layer.

In a third sub-step, a black matrix is formed on the heat conducting layer.

The third sub-step may include forming a black matrix on the heat conducting layer using an ink-jet printing technology. The black matrix may be made from a black ink-based material.

An embodiment of the present disclosure provides a display device including the display panel as described above. The display device may be any product or component with a display function, such as a mobile phone, a tablet computer, a television, a display, a notebook computer, a digital photo frame, a navigator, or the like.

Figure 17:
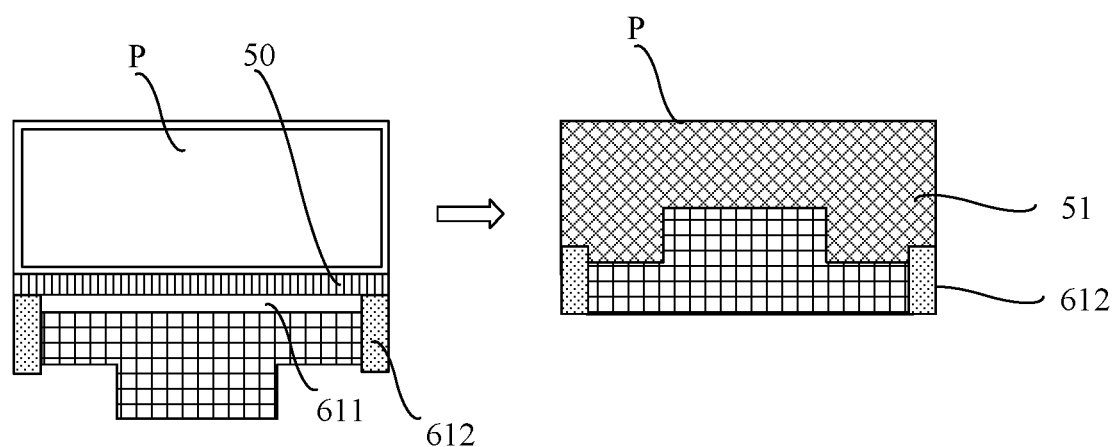
FIG. 17 is a schematic diagram of a partial structure of a display device according to an embodiment of the present disclosure.

FIG. 17 is a schematic diagram of a partial structure of a display device according to an embodiment of the present disclosure. As shown in FIG. 17, the display device may further include a heat dissipating layer 51 and a heat conducting structure 50. With reference to FIGS. 14 and 15, the heat dissipating layer 51 is disposed on the back side of the display panel P. As shown in FIG. 6, the heat conducting layer 2 is connected to the heat conducting structure 50 to transfer heat absorbed by the heat conducting layer 2 from the black matrix to the heat conducting structure 50.

With reference to FIGS. 6 and 17, the heat conducting structure 50 is connected to the heat dissipating layer 51. That is, the heat conducting layer 2 is connected to the heat dissipating layer 51 through the heat conducting structure 50. In this way, after the heat conducting layer 2 conducts heat to the heat conducting structure 50, the heat is conducted to the heat dissipating layer 51 by the heat conducting structure 50.

As shown in FIG. 17, the display panel P is connected to a chip on film (COF). The COF is a soft granular film configured to fix an integrated circuit on a flexible circuit board. Heat conducting areas 612 are provided on two sides of a binding area 611 of the COF. The binding area 611 of the COF is bound to the display panel, and the heat conducting area 612 is attached to the heat conducting structure 50, to simultaneously realize the electricity conducting and heat conducting functions of the COF. Finally, the COF is folded to make the heat conducting area 612 of the COF be connected to the heat dissipating layer 51 on the back side of the display panel P, so that heat in the color filter structure is finally transferred to the heat dissipating layer 51.

In an example, the heat conducting structure 50 is heat conducting silica gel.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising an array substrate, an OLED light-emitting layer and a color filter structure laminated in sequence, wherein
the color filter structure comprises a color filter layer, a black matrix and a heat conducting layer, wherein the color filter layer and the black matrix are disposed in a same layer, and the heat conducting layer is disposed on at least one side of the black matrix and configured to conduct heat from the black matrix to a periphery of the color filter structure,
wherein the heat conducting layer is a meshy metal layer, and an area of the meshy metal layer corresponding to the color filter layer is an opening area; and
at least part of the heat conducting layer is disposed between a layer where the black matrix is disposed and the OLED light-emitting layer in a direction perpendicular to the array substrate,
wherein the black matrix comprises a first side face and a second side face connected to each other, the first side face facing the OLED light-emitting layer, and the second side face facing the color filter layer; and
the heat conducting layer comprises a reflecting portion and a heat conducting portion connected to each other, the heat conducting portion being disposed on the first side face, and the reflecting portion being disposed on the second side face.

2. The display panel according to claim 1, wherein a dihedral angle formed by a first surface of the reflecting portion and a first surface of the heat conducting portion ranges from 70° to 110°, the first surface of the reflecting portion being a surface of the reflecting portion facing the color filter layer, and the first surface of the heat conducting portion being a surface of the heat conducting portion facing the OLED light-emitting layer.

3. The display panel according to claim 1, further comprising a touch layer, wherein the heat conducting layer and the touch layer are in a same layer, and the touch layer and the heat conducting layer are insulated from each other.

4. The display panel according to claim 3, wherein the touch layer comprises a plurality of first touch traces and a plurality of second touch traces, the first touch traces and the second touch traces being insulated from each other and intersecting to define a plurality of dummy areas,
the heat conducting layer comprises a plurality of meshy structures arranged in an array and heat conducting lines connecting adjacent meshy structures, wherein the plurality of meshy structures and the plurality of dummy areas are in one-to-one correspondence, each of the meshy structures is in a corresponding dummy area, and an orthographic projection of the black matrix on the array substrate at least partially overlaps an orthographic projection of the meshy structures on the array substrate.

5. The display panel according to claim 4, wherein both the first touch traces and the second touch traces are meshy metal wires.

6. The display panel according to claim 4, wherein the touch layer further comprises a first touch sensing structure and a second touch sensing structure, wherein
the first touch sensing structure is connected to the first touch trace and disposed on at least one side of the first touch trace, and the second touch sensing structure is connected to the second touch trace and disposed on at least one side of the second touch trace;
the first touch sensing structure and the second touch sensing structure are disposed at an intersection of the first touch trace and the second touch trace, the first touch sensing structure and the second touch sensing structure are insulated from each other; and at least part of an outline of an orthographic projection of the first touch sensing structure on the array substrate faces an outline of an orthographic projection of the second touch sensing structure on the array substrate.

7. The display panel according to claim 3, wherein the heat conducting layer comprises a titanium metal layer, an aluminum metal layer and an aluminium oxide layer laminated in sequence, and the aluminium oxide layer is in contact with the black matrix.

8. The display panel according to claim 1, wherein the heat conducting layer is a transparent inorganic heat conducting material layer disposed in one of the following manners:
the transparent inorganic heat conducting material layer is disposed between a layer where the black matrix is disposed and the OLED light-emitting layer in a direction perpendicular to the array substrate; or
the layer where the black matrix is disposed is disposed between the transparent inorganic heat conducting material layer and the OLED light-emitting layer in the direction perpendicular to the array substrate.

9. The display panel according to claim 8, wherein the transparent inorganic heat conducting material layer is an aluminium nitride layer.

10. The display panel according to claim 1, wherein an orthographic projection of the heat conducting layer on the array substrate and an orthographic projection of the black matrix on the array substrate meets one of following relationships:
the orthographic projection of the heat conducting layer on the array substrate overlaps the orthographic projection of the black matrix on the array substrate; or
the orthographic projection of the heat conducting layer on the array substrate is within the orthographic projection of the black matrix on the array substrate.

11. A display device, comprising a display panel, wherein the display panel comprises an array substrate, an OLED light-emitting layer and a color filter structure laminated in sequence, wherein
the color filter structure comprises a color filter layer, a black matrix and a heat conducting layer, the color filter layer and the black matrix being disposed in a same layer, and the heat conducting layer being disposed on one side face of the black matrix and configured to conduct heat from the black matrix to a periphery of the color filter structure,
wherein the heat conducting layer is a transparent inorganic heat conducting material layer disposed in one of the following manners:
the transparent inorganic heat conducting material layer is disposed between a layer where the black matrix is disposed and the OLED light-emitting layer in a direction perpendicular to the array substrate; and
the layer where the black matrix is disposed is disposed between the transparent inorganic heat conducting material layer and the OLED light-emitting layer in the direction perpendicular to the array substrate, wherein the black matrix comprises a first side face and a second side face connected to each other, the first side face facing the OLED light-emitting layer, and the second side face facing the color filter layer; and the heat conducting layer comprises a reflecting portion and a heat conducting portion connected to each other, the heat conducting portion being disposed on the first side face, and the reflecting portion being disposed on the second side face.

12. The display device according to claim 11, further comprising a heat dissipating layer and a heat conducting structure, wherein the heat dissipating layer is disposed on a back side of the display panel, and the heat conducting layer is connected to the heat dissipating layer via the heat conducting structure.

13. The display device according to claim 12, further comprising a chip on film comprising a heat conducting area, wherein a part of the heat conducting area is attached to the heat conducting structure, and another part of the heat conducting area is connected to the heat dissipating layer.

14. The display device according to claim 11, wherein the heat conducting layer is a meshy metal layer, and an area of the meshy metal layer corresponding to the color filter layer is an opening area; and at least part of the heat conducting layer is disposed between a layer where the black matrix is disposed and the OLED light-emitting layer in a direction perpendicular to the array substrate.

15. The display device according to claim 11, wherein a dihedral angle formed by a first surface of the reflecting portion and a first surface of the heat conducting portion ranges from 70° to 110°, the first surface of the reflecting portion being a surface of the reflecting portion facing the color filter layer, and the first surface of the heat conducting portion being a surface of the heat conducting portion facing the OLED light-emitting layer.

16. The display device according to claim 15, wherein the heat conducting layer comprises a titanium metal layer, an aluminum metal layer and an aluminium oxide layer laminated in sequence, and the aluminium oxide layer is in contact with the black matrix.

* * * * *